(12) United States Patent
Shibayama et al.

(10) Patent No.: US 7,507,971 B2
(45) Date of Patent: Mar. 24, 2009

(54) RADIOACTIVE RAY DETECTOR

(75) Inventors: Katsumi Shibayama, Hamamatsu (JP);
Yutaka Kusuyama, Hamamatsu (JP);
Masahiro Hayashi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 246 days.

(21) Appl. No.: 10/552,705

(22) PCT Filed: Apr. 9, 2004

(86) PCT No.: PCT/JP2004/005156

§ 371 (c)(1),
(2), (4) Date: Aug. 24, 2006

(87) PCT Pub. No.: WO2004/093194

PCT Pub. Date: Oct. 28, 2004

(65) Prior Publication Data

US 2007/0007459 A1 Jan. 11, 2007

(30) Foreign Application Priority Data

Apr. 11, 2003 (JP) ............................. 2003-108337

(51) Int. Cl.
*G01T 1/26* (2006.01)
(52) U.S. Cl. ................... 250/371; 250/370.11
(58) Field of Classification Search ............ 250/370.11, 250/371
See application file for complete search history.

(56) References Cited

U.S. PATENT DOCUMENTS

| | | | |
|---|---|---|---|
| 6,292,529 B1 * | 9/2001 | Marcovici et al. ............. 378/19 |
| 6,437,340 B1 * | 8/2002 | Finkler et al. .......... 250/370.11 |
| 6,844,570 B2 * | 1/2005 | Sekine et al. ................. 257/80 |
| 6,876,086 B2 * | 4/2005 | Sekine et al. ............... 257/777 |
| 7,050,538 B2 * | 5/2006 | Tashiro et al. ............. 378/98.8 |
| 7,301,214 B2 * | 11/2007 | Sekine et al. ............... 257/432 |

(Continued)

FOREIGN PATENT DOCUMENTS

JP     8-330469     12/1996

(Continued)

*Primary Examiner*—David P Porta
*Assistant Examiner*—David S Baker
(74) *Attorney, Agent, or Firm*—Drinker Biddle & Reath LLP

(57) ABSTRACT

A wiring substrate section 2 is provided between a radiation detecting section 1, which is formed of a scintillator 10 and a PD array 15, and signal processing elements 30 and 32 for processing a detected signal outputted from the PD array 15, and the wiring substrate section 2 has a wiring substrate 20 which is formed of a glass material having a radiation shielding function and in which a conductive member 21 serving as a conduction path for guiding the detected signal therethrough is provided in a through hole 20c. Relative to the through hole 20c of the wiring substrate 20, the signal processing elements 30 and 32 of the signal processing section 3, located downstream of the wiring substrate 20, are each disposed in an area excluding those areas on the extension of the through holes 20c, and this allows the signal processing elements 30 and 32 not to be seen through the through holes 20c. This arrangement realizes a radiation detector which suppresses radiation made incident on the signal processing means located downstream of the wiring substrate.

10 Claims, 14 Drawing Sheets

U.S. PATENT DOCUMENTS

| | | | |
|---|---|---|---|
| 7,326,907 B2 * | 2/2008 | Shibayama et al. | 250/214.1 |
| 2002/0038851 A1 * | 4/2002 | Kajiwara et al. | 250/368 |
| 2002/0195676 A1 * | 12/2002 | Hamamoto et al. | 257/433 |
| 2006/0244153 A1 * | 11/2006 | Shibayama et al. | 257/777 |
| 2007/0075408 A1 * | 4/2007 | Shibayama et al. | 257/678 |

FOREIGN PATENT DOCUMENTS

| | | |
|---|---|---|
| JP | 9-288184 | 11/1997 |
| JP | 2001-339057 | 12/2001 |
| JP | 2003-60186 | 2/2003 |

* cited by examiner

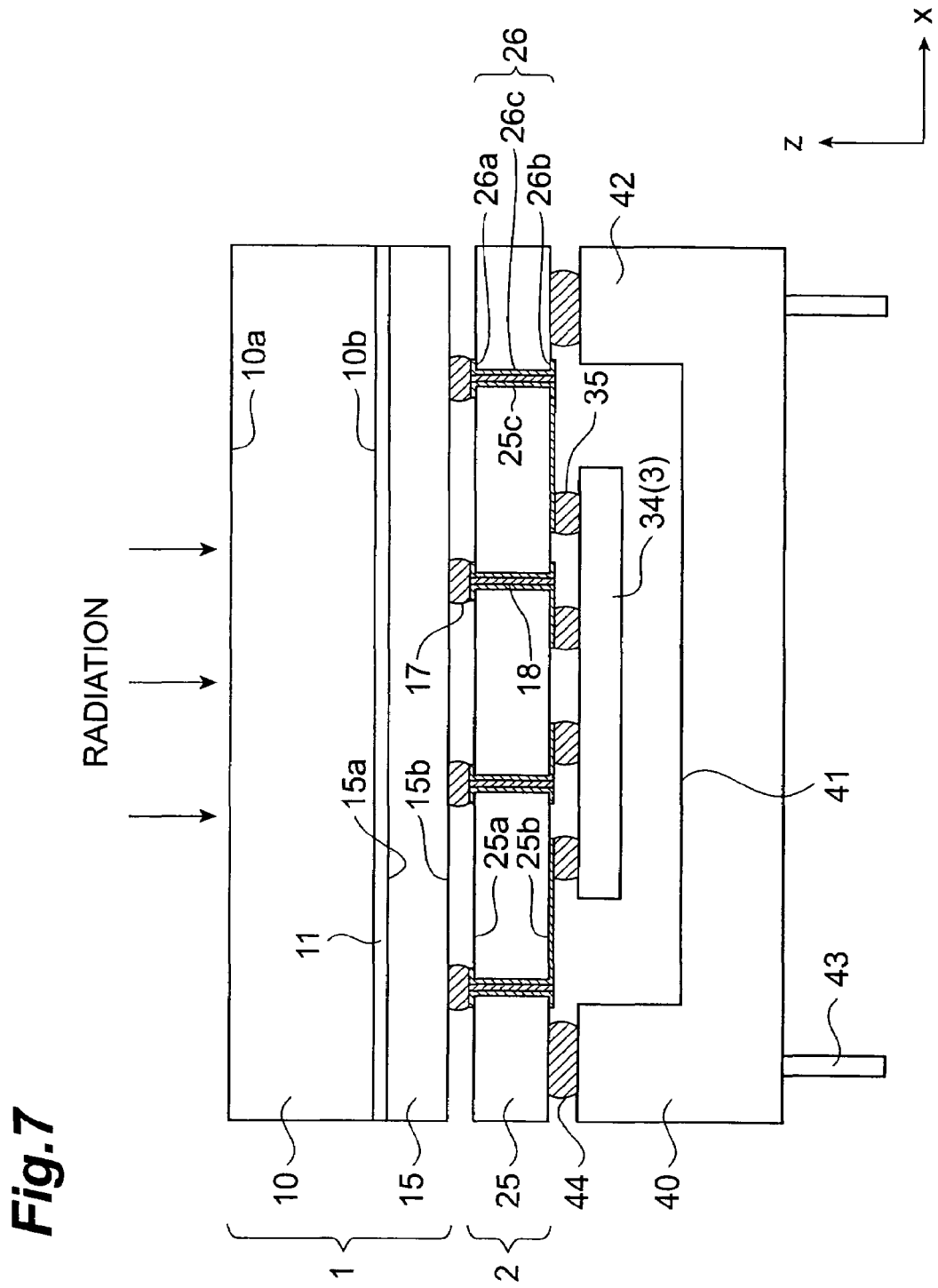

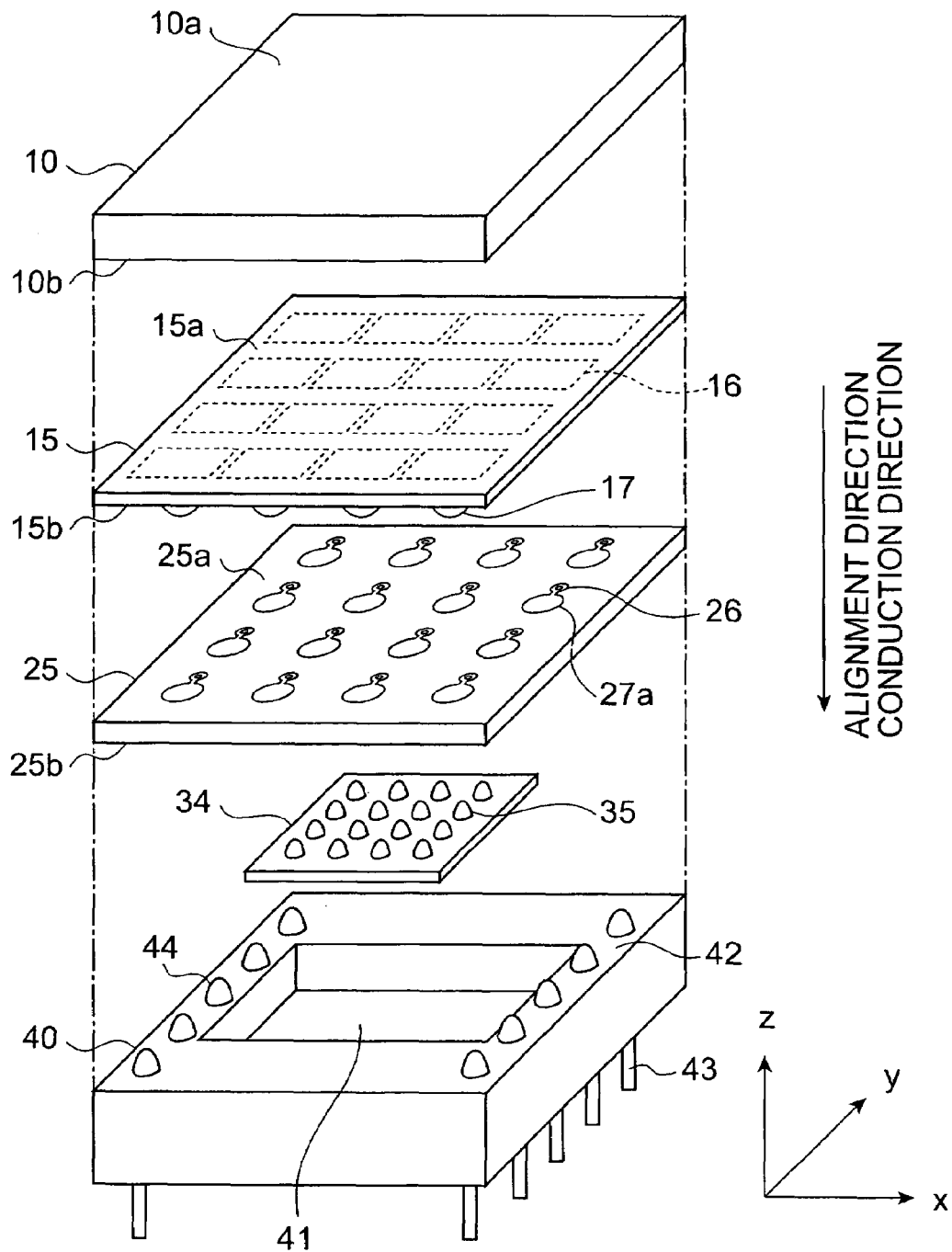

RADIOACTIVE RAY DETECTOR

TECHNICAL FIELD

This invention relates to a radiation detector in which employed is a wiring substrate with a conduction path for guiding an electric signal.

BACKGROUND ART

Radiation detectors for use with CT sensors include a detector with a scintillator placed on the light-incident surface of a semiconductor photodetecting element array such as a photodiode array. In such a radiation detector, when the radiation to be detected is made incident on the scintillator, such as X-rays, gamma rays, or charged particles, scintillation light is generated by the radiation in the scintillator. The scintillation light is then detected with the semiconductor photodetecting elements, thereby allowing the radiation to be detected.

The photodetecting element array is also provided with a signal processing element for processing a detected signal that is outputted from each photodetecting element. In this case, the photodetecting element and the signal processing element can be electrically connected therebetween using various types of wirings, or conduction paths provided in a wiring substrate (e.g., see Japanese Patent Application Laid-Open No. H8-330469).

DISCLOSURE OF THE INVENTION

In the above-mentioned radiation detector, part of radiation made incident on the scintillator normally transmits the scintillator and the photodetecting element array. In this case, the scintillator, the photodetecting element array, the wiring substrate, and the signal processing element may be located along a predetermined alignment direction, and this arrangement raises a problem that the radiation having transmitted the scintillator and the like transmits the wiring substrate to be made incident upon the signal processing element located downstream of the arrangement. The radiation made incident on the signal processing element in this manner would result in damage to the signal processing element due to the radiation, thereby causing degradation in the characteristics of the radiation detector such as sensitivity, reliability, or life.

The present invention has been developed to address the above-mentioned problems, and therefore, an object of the invention is to provide a radiation detector which suppresses radiation made incident on signal processing means located downstream of a wiring substrate.

To achieve such an object, a radiation detector according to the present invention includes (1) radiation detecting means for detecting incident radiation to output a detected signal, (2) signal processing means for processing the detected signal from the radiation detecting means, and (3) a wiring substrate section having a wiring substrate with a conduction path provided for guiding the detected signal between a signal input surface and a signal output surface, the radiation detecting means and the signal processing means being connected to the signal input surface and the signal output surface, respectively, wherein (4) the wiring substrate includes a glass substrate formed of a predetermined glass material having a radiation shielding function and provided with a through hole, and a conductive member provided in the through hole to serve as the conduction path for establishing electrical continuity between the signal input surface and the signal output surface, and (5) the radiation detecting means, the wiring substrate section, and the signal processing means are located in this order along a predetermined alignment direction, with the signal processing means being disposed with respect to the wiring substrate within an area other than an area on an extension of the through hole.

In the above-mentioned radiation detector, the wiring substrate used to electrically connect between the radiation detecting means and the signal processing means is formed of a glass substrate of a predetermined glass material. The signal processing means is disposed relative to the through hole of the conduction path provided in the glass substrate so as to be dislocated from an area where the through hole is provided, thereby allowing the signal processing means not to be seen through the through hole.

According to such an arrangement, a portion with no through hole in the wiring substrate allows the glass material thereof to suppress radiation transmitting from the signal input surface to the signal output surface. Even another portion with a through hole in the wiring substrate will also allow radiation having passed through the through hole not to be made incident on the signal processing means. This realizes a radiation detector which suppresses radiation made incident on the signal processing means irrespective of the presence of the through hole in the wiring substrate.

In the above-mentioned arrangement, the wiring substrate preferably has an electrode pad provided at a predetermined portion facing the signal processing means on the signal output surface of the glass substrate and a wiring for electrically connecting between the electrode pad and the corresponding conductive member. This allows for transferring an electric signal from the radiation detecting means to the signal processing means via the conductive member provided in the wiring substrate, the wiring, and the electrode pad. It is also acceptable to employ other arrangements.

Alternatively, a radiation detector according to the present invention includes (1) radiation detecting means for detecting incident radiation to output a detected signal, (2) signal processing means for processing the detected signal from the radiation detecting means, and (3) a wiring substrate section having a wiring substrate with a conduction path provided for guiding the detected signal between a signal input surface and a signal output surface, the radiation detecting means and the signal processing means being connected to the signal input surface and the signal output surface, respectively, wherein (4) the wiring substrate includes a glass substrate formed of a predetermined glass material having a radiation shielding function and provided with a through hole, and a conductive member provided in the through hole to serve as the conduction path for establishing electrical continuity between the signal input surface and the signal output surface, and (5) the radiation detecting means, the wiring substrate section, and the signal processing means are located in that order along a predetermined alignment direction, while an opening of the through hole provided in the wiring substrate from the signal input surface to the signal output surface is blocked with a shield member having a radiation shielding function.

In the above-mentioned radiation detector, the wiring substrate used to electrically connect between the radiation detecting means and the signal processing means is formed of a glass substrate of a predetermined glass material. The shield member for blocking the opening of the through hole in the wiring substrate is provided for the through hole of the conduction path provided in the glass substrate, thereby allowing the signal processing means not to be seen through the through hole.

According to such an arrangement, a portion with no through hole in the wiring substrate allows the glass material thereof to suppress radiation transmitting from the signal input surface to the signal output surface. Another portion with a through hole in the wiring substrate will also allow the shield member to suppress radiation passing through the through hole. This arrangement realizes a radiation detector which suppresses radiation made incident on the signal processing means irrespective of the presence of the through hole in the wiring substrate.

In the above-mentioned arrangement, the shield member is preferably configured such that a predetermined shield material having a radiation shielding function is filled in the through hole. Alternatively, the shield member is preferably a bump electrode which is formed of a predetermined shield material having a radiation shielding function and which is electrically connected to the conductive member provided in the through hole. These arrangements make it possible to shield against radiation in a simple manner in the through hole of the wiring substrate. It is also acceptable to employ other arrangements.

As for the glass material used for the wiring substrate, the glass substrate is preferably formed of a glass material that contains lead. This allows for effectively suppressing radiation transmitting the wiring substrate. It is also acceptable to employ a substrate formed of another glass material having a radiation shielding function.

As for the arrangement of the conduction path in the wiring substrate, the conductive member can be formed on an inner wall of the through hole provided in the glass substrate. Alternatively, the conductive member can also be filled in the through hole provided in the glass substrate. These conductive members can be used as the conduction path, thereby allowing for transferring an electric signal between the signal input surface and the signal output surface of the wiring substrate in a preferred manner.

The glass substrate of the wiring substrate is preferably provided with a plurality of through holes while a plurality of hollow glass members that are open at both ends are fused together and integrally formed. It is also acceptable to use other glass substrates configured in a variety of ways.

As for the arrangement of the radiation detecting means, the radiation detecting means may include a scintillator for generating scintillation light by radiation made incident, and a semiconductor photodetecting element for detecting the scintillation light from the scintillator. Alternatively, the radiation detecting means may include a semiconductor detecting element for detecting radiation made incident thereon.

It is preferable that at least either the wiring substrate section and the radiation detecting means or the wiring substrate section and the signal processing means be electrically connected to each other via a bump electrode. Such a metal bump electrode can be used as electrical connection means, thereby electrically connecting between each portion in a preferred manner.

BRIEF DESCRIPTION OF THE DRAWINGS

FIG. 7 is a sectional side view illustrating the sectional structure of a radiation detector according to a second embodiment;

FIG. 8 is an exploded perspective view illustrating the configuration of the radiation detector shown in FIG. 7;

BEST MODES FOR CARRYING OUT THE INVENTION

Figure 1:
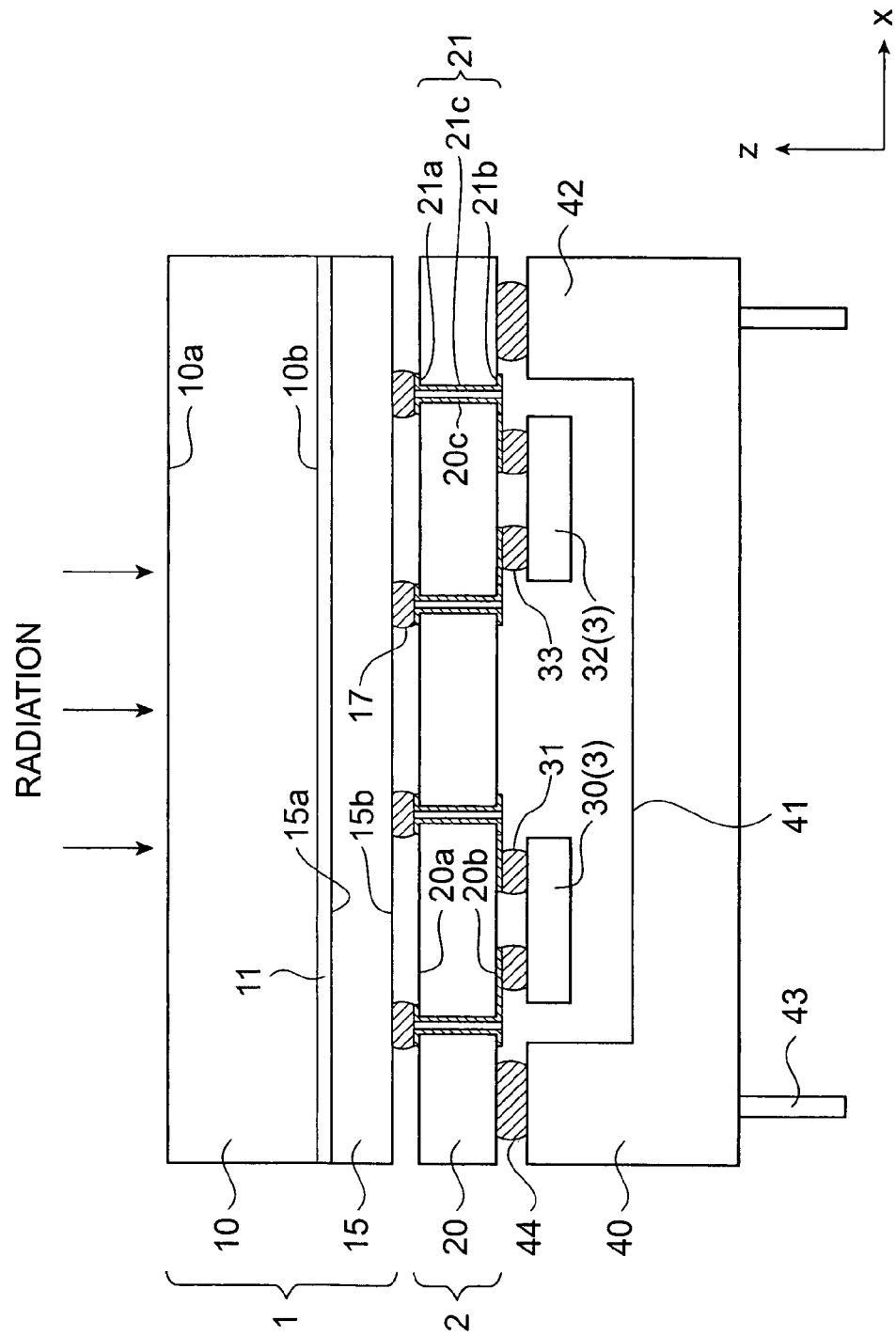
FIG. 1 is a sectional side view illustrating the sectional structure of a radiation detector according to a first embodiment.

Preferred embodiments of the radiation detector according to the present invention will be described below in detail with reference to the drawings. The same elements will be described by the same reference symbols in the description of the drawings, without redundant description. It is noted that the dimensional ratios in the drawings do not always agree with those in the description.

Figure 2:
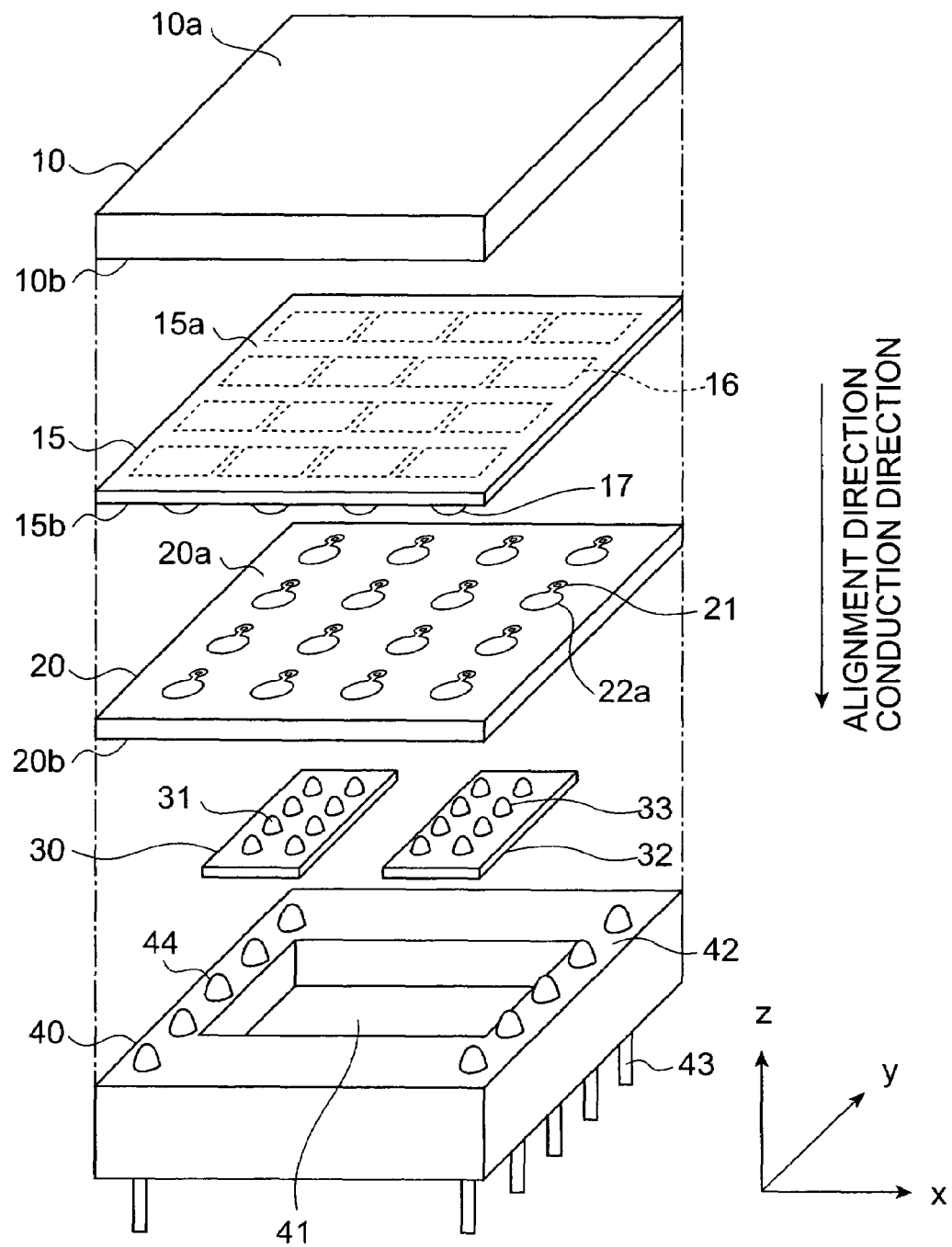
FIG. 2 is an exploded perspective view illustrating the configuration of the radiation detector shown in FIG. 1.

FIG. 1 is a sectional side view illustrating the sectional structure of a radiation detector according to a first embodiment of the present invention. FIG. 2 is an exploded perspective view illustrating components in the configuration of the radiation detector shown in FIG. 1. For convenience in description, as shown in FIG. 1 and FIG. 2, it is defined in each of the following drawings that radiation is incident along the direction of z-axis, and two axes orthogonal to the z-axis are the x-axis and y-axis. In the configuration herein, the negative direction of the z-axis is the conduction direction from a signal input surface to a signal output surface in the wiring substrate, and the alignment direction of the components in the radiation detector.

The radiation detector shown in FIG. 1 includes a radiation detecting section 1, a wiring substrate section 2, and a signal processing section 3. As shown in FIG. 2, these components are arranged in that order from the upstream side (the upper side in the figure) to the downstream side (the lower side) along the predetermined alignment direction.

The radiation detecting section 1 is detecting means for detecting a radiation to be detected made incident upon the radiation detector, such as X-rays, gamma rays, or charged particles, to output a detected signal of an electric signal corresponding thereto. In this embodiment, the radiation detecting section 1 includes a scintillator 10 and a photodiode array 15.

The scintillator 10 forms the upstream portion of the radiation detecting section 1, with its upper surface 10a serving as a radiation-incident surface of the radiation detector. The scintillator 10 generates scintillation light of a predetermined wavelength by radiation made incident from the incident surface 10a.

The photodiode array (PD array) 15 forms the downstream portion of the radiation detecting section 1. The PD array 15 is a photodetecting element array in which a plurality of photodiodes (PDs) which are semiconductor photodetecting elements for detecting scintillation light from the scintillator 10 are arrayed. The lower surface of the scintillator 10 serving as a light output surface 10b and the upper surface of the PD array 15 serving as a light-incident surface 15a are optically connected to each other with an optical adhesive 11 that transmits the scintillation light.

As an exemplary configuration of the PD array 15, FIG. 2 shows a PD array in which photodiodes 16 equal in number to 4×4=16 are two-dimensionally arrayed along alignment axes or the x-axis and the y-axis. The lower surface 15b of the PD array 15 serves as a signal output surface for outputting a detected signal from each of the photodiodes 16. On the lower surface 15b, sixteen bump electrodes 17 for outputting the detected signal are disposed in an array of 4×4 corresponding to each of the photodiodes 16.

Like the electrode for outputting the detected signal, although not illustrated, the substrate electrode of the photodiodes is formed with a bump electrode on the lower surface 15b of the PD array 15. Likewise, only shown are those parts of the electrode pads or through holes formed at a wiring substrate 20, signal processing elements 30 and 32, and bump electrodes 31 and 33 and related to the output of the detected signal from the PD array 15. In practice, although not shown, also required are a drive electrode, a substrate electrode, and an electrode pad for video output and a bump electrode.

Downstream of the radiation detecting section 1, provided is the wiring substrate section 2. In this embodiment, the wiring substrate section 2 has the wiring substrate 20 formed with a conduction path for guiding an electric signal between the signal input surface and the signal output surface. The wiring substrate 20 is formed of a glass substrate of a predetermined glass material having a radiation shielding function. Such a glass material preferably includes, e.g., lead glass containing lead.

Figure 3A:
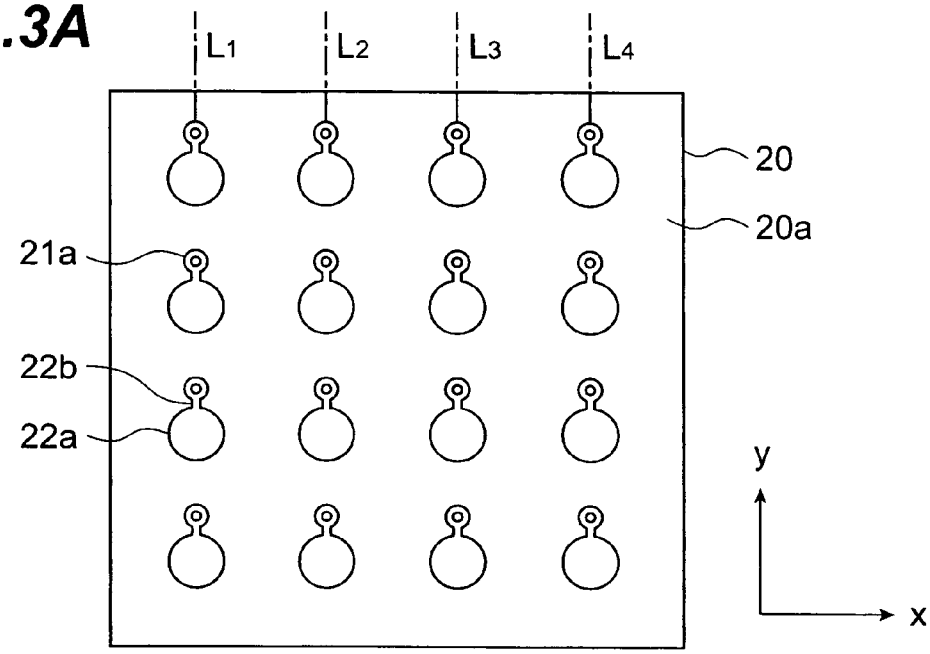
FIGS. 3A and 3B are plan views illustrating (A) the configuration of a signal input surface of a wiring substrate, and (B) the configuration of a signal output surface thereof.
Figure 3B:
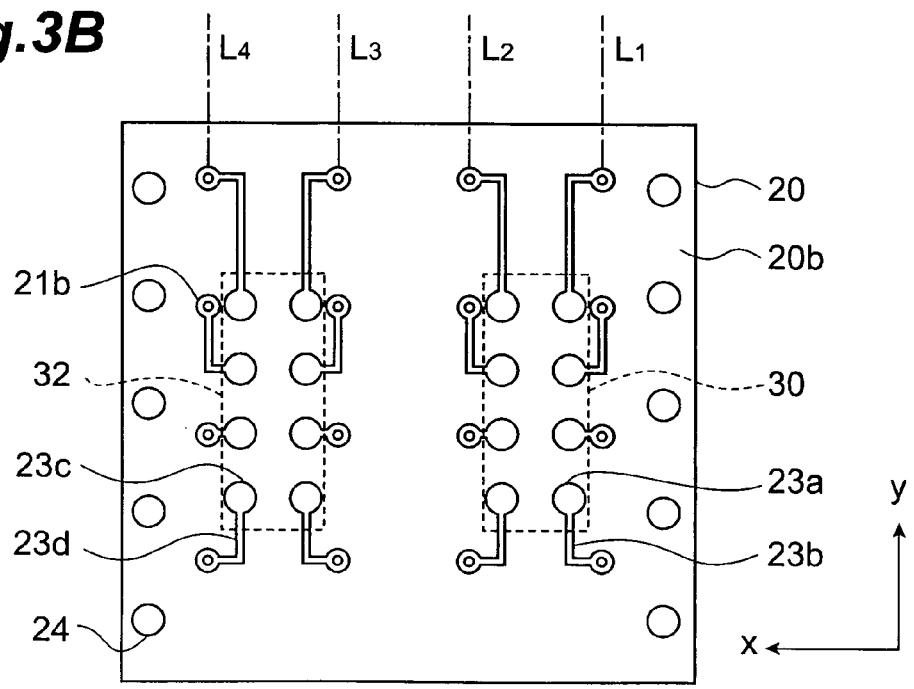

FIGS. 3A and 3B are plan views each illustrating the configuration of the wiring substrate 20; FIG. 3A showing the upper surface thereof as a signal input surface 20a, FIG. 3B showing the lower surface thereof as a signal output surface 20b.

The glass substrate constituting the wiring substrate 20 includes a plurality of through holes 20c formed between the input surface 20a and the output surface 20b. Also provided in the respective through holes 20c is a conductive member 21 that serves as a conduction path through which electrical continuity is established between the input surface 20a and the output surface 20b. This embodiment employs the configuration in which provided are the through holes 20c and the conductive members 21 equal in number to 4×4=16, corresponding to the configuration of the PD array 15. These through holes 20c and conductive members 21 are formed with the same pitch as those of the bump electrodes 17 at the PD array 15.

More specifically, the conductive member 21 includes a conducting portion 21c formed inside the through hole 20c, an input portion 21a formed on the outer peripheral portion of the through hole 20c on the input surface 20a in connection with the conducting portion 21c, and an output portion 21b formed on the outer peripheral portion of the through hole 20c on the output surface 20b in connection with the conducting portion 21c.

As shown in FIG. 3A, there is provided an electrode pad 22a on the input surface 20a of the wiring substrate 20 in addition to the input portion 21a of the conductive member 21. The electrode pad 22a is positioned corresponding to the bump electrode 17 on the output surface 15b of the PD array 15. The electrode pad 22a is also electrically connected to the corresponding input portion 21a of the conductive member 21 via a wiring 22b. This configuration allows the photodiode 16 for outputting a detected signal of the PD array 15 to be electrically connected via the bump electrode 17, the electrode pad 22a, and the wiring 22b to the conductive member 21 which is a conduction path that transfers the detected signal in the wiring substrate 20.

As shown in FIG. 3B, electrode pads 23a and 23c are formed on the output surface 20b of the wiring substrate 20 in addition to the output portion 21b of the conductive member 21. The electrode pads 23a and 23c are each electrically connected to the output portion 21b of the corresponding conductive member 21 via wirings 23b and 23d, respectively. There is also provided an electrode pad 24 on the output surface 20b. The electrode pad 24 is used for connection to a housing 40, which is to be described later. Although not illustrated, part or all of the electrode pads 24 are electrically connected to a predetermined portion of the signal processing element.

The signal processing section 3 and the housing (package) 40 are located downstream of the wiring substrate section 2. In this embodiment, the signal processing section 3 includes the two signal processing elements 30 and 32 which are each provided with a signal processing circuit for processing the detected signal from the PD array 15 of the radiation detecting section 1.

A signal processing element 30 is located at an area on the output surface 20b of the wiring substrate 20; the area is sandwiched between the four through holes disposed in the first column $L_1$ from the negative side along the x-axis (the left side when viewed from the radiation detecting section 1) and the four through holes disposed in the second column $L_2$. As shown in FIG. 3B, the signal processing element 30 is disposed in an area between the columns $L_1$ and $L_2$, the area excluding those on the extension of the through holes 20c on the columns $L_1$ and $L_2$.

In an area on the output surface 20b of the wiring substrate 20 where the signal processing element 30 is placed, eight electrode pads 23a are provided which are electrically connected to the corresponding conductive members 21 in the columns $L_1$ and $L_2$ via the wirings 23b. On the upper surface of the signal processing element 30, also provided are eight bump electrodes 31 at positions corresponding to the electrode pads 23a. This configuration allows the eight of the conductive members 21 of the wiring substrate 20 in the columns $L_1$ and $L_2$ to be electrically connected to the signal processing circuit provided in the signal processing element 30 via the output portions 21b, the wirings 23b, the electrode pads 23a, and the bump electrodes 31.

A signal processing element 32 is located at an area on the output surface 20b of the wiring substrate 20; the area is sandwiched between the four through holes disposed in the first column $L_4$ from the positive side along the x-axis (the right side when viewed from the radiation detecting section 1) and the four through holes disposed in the second column $L_3$. As shown in FIG. 3B, the signal processing element 32 is disposed in an area between the columns $L_3$ and $L_4$, the area excluding those on the extension of the through holes $20c$ on the columns $L_3$ and $L_4$.

In an area on the output surface $20b$ of the wiring substrate 20 where the signal processing element 32 is placed, eight electrode pads $23c$ are provided which are electrically connected to the corresponding conductive members 21 in the columns $L_3$ and $L_4$ via the wirings $23d$. On the upper surface of the signal processing element 32, also provided are eight bump electrodes 33 at positions corresponding to the electrode pads $23c$. This configuration allows the eight of the conductive members 21 of the wiring substrate 20 in the columns $L_3$ and $L_4$ to be electrically connected to the signal processing circuit provided in the signal processing element 32 via the output portions $21b$, the wirings $23d$, the electrode pads $23c$, and the bump electrodes 33.

The housing 40 is a holding member for integrally holding the radiation detecting section 1, the wiring substrate section 2, and the signal processing section 3. The housing 40 includes an element receiving portion 41 which is provided as a recessed portion on the upper surface thereof to receive the signal processing elements 30 and 32 therein, and a support portion 42 which is provided on the outer peripheral portion of the element receiving portion 41, connected to the electrode pads 24 of the wiring substrate 20 via bump electrodes 44, and supporting the radiation detecting section 1, the wiring substrate section 2, and the signal processing section 3. On the lower surface of the housing 40, there are provided leads 43 used for inputting and outputting an electric signal from and to an external portion.

In the above-mentioned arrangement, radiation such as X-rays made incident upon the scintillator 10 of the radiation detecting section 1 will generate scintillation light in the scintillator 10, allowing the scintillation light to be made incident upon the photodiodes 16 of the PD array 15 via the optical adhesive 11. The photodiodes 16 detect this scintillation light to output electric signals as detected signals corresponding to the detection of the radiation.

The detected signal outputted from each of the photodiodes 16 of the PD array 15 is sent to the signal processing elements 30 and 32 via the corresponding bump electrode 17, conductive member 21 of the wiring substrate 20, and bump electrodes 31 and 33 sequentially. Then, the signal processing circuit of the signal processing elements 30 and 32 performs the required signal processing on the detected signal.

An explanation will now be made to the effects of the radiation detector according to this embodiment.

In the radiation detector shown in FIG. 1 to FIGS. 3A and 3B, the wiring substrate 20 used for electrically connecting between the radiation detecting section 1 and the signal processing section 3 is formed of a glass substrate of a predetermined glass material. Additionally, the signal processing elements 30 and 32 of the signal processing section 3 are each dislocated from an area where the through hole $20c$ of the conduction path in the glass substrate is provided, thereby allowing the signal processing elements 30 and 32 not to be seen through the through hole $20c$.

According to such an arrangement, a portion with no through hole $20c$ in the wiring substrate 20 allows the glass material thereof to suppress radiation transmitting from the signal input surface $20a$ to the signal output surface $20b$. Even another portion with the through hole $20c$ in the wiring substrate 20 will also allow the radiation having passed through the through hole $20c$ not to be made incident upon the signal processing elements 30 and 32. This allows for suppressing the radiation made incident upon the signal processing section 3 irrespective of the presence of the through hole $20c$ in the wiring substrate 20, thereby realizing a radiation detector which can ensure that degradation resulting from damage due to radiation in characteristics such as sensitivity, reliability, and life is suppressed.

As described above, it is preferable to use a glass material containing lead as the glass material used for the glass substrate in the wiring substrate 20 of the wiring substrate section 2. Use of the lead glass will make it possible to effectively suppress the transmission of radiation through the wiring substrate section 2. Here, it is preferable to appropriately set the amount of lead contained in the glass material depending on the level of the radiation shielding function required in the radiation detector. It is also acceptable to use a glass material other than the lead glass.

A description will now be made for the wiring substrate in the wiring substrate section shown in FIG. 1 and the glass substrate used therefore.

As described above, the wiring substrate 20 employs a glass substrate in which the through hole $20c$ for forming the conductive member 21 serving as a conduction path is provided between the input surface $20a$ on the radiation detecting section 1 side and the output surface $20b$ on the signal processing section 3 side. As such a glass substrate, for example, it is possible to use a glass substrate having a plurality of through holes while a plurality of hollow glass members that are open at both ends are fused together and integrally formed.

Figure 4A:
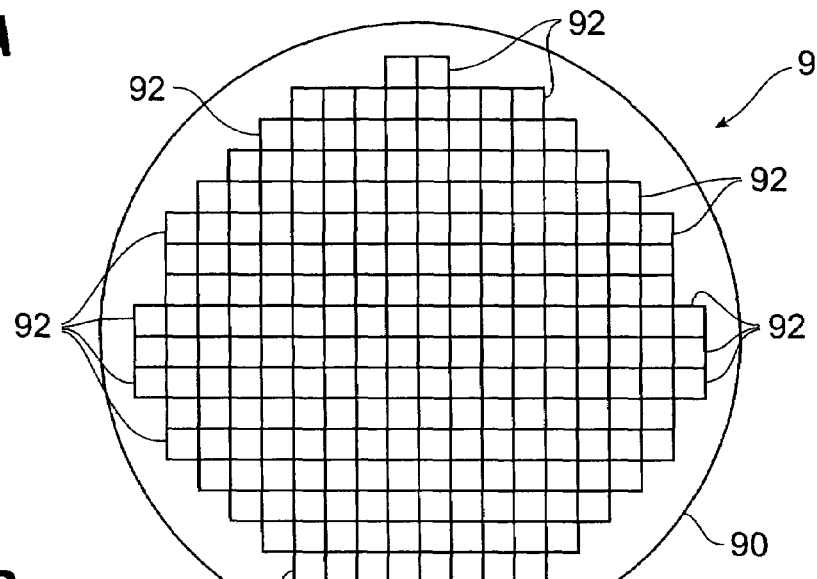
FIGS. 4A to 4C are views illustrating an example of a glass substrate provided with a plurality of through holes.
Figure 4B:
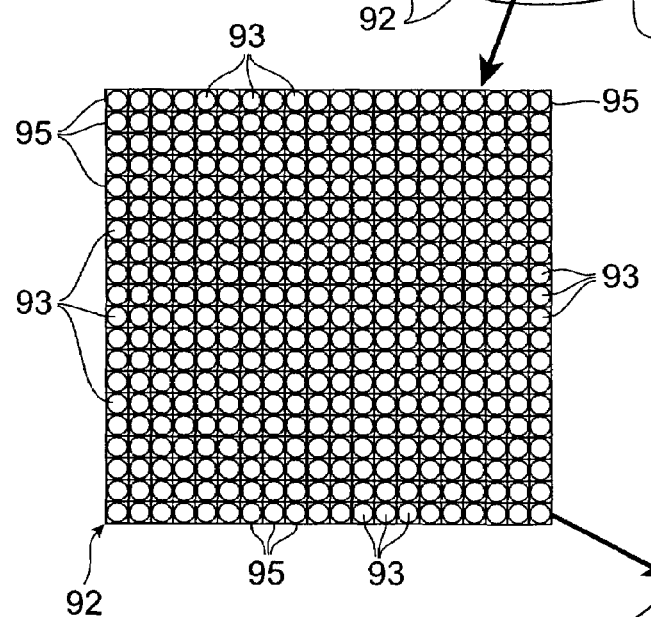
Figure 4C:
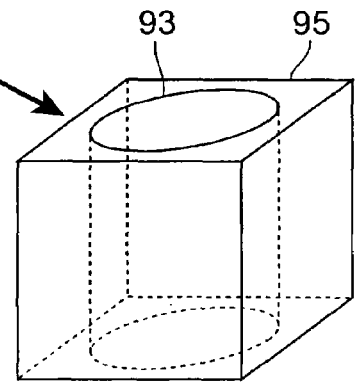

FIGS. 4A to 4C are views illustrating an example of the above-mentioned glass substrate provided with a plurality of through holes. Here, shown is a general example of the configuration of a glass substrate having a plurality of through holes. Accordingly, the glass substrate shown in FIGS. 4A to 4C has a shape and configuration different from those of the wiring substrate used in the radiation detector shown in FIG. 1.

FIG. 4A is a plan view illustrating the configuration of the glass substrate, FIG. 4B being a plan view illustrating the configuration of a multi-channel member included in the glass substrate, FIG. 4C being a perspective view illustrating the configuration of the glass member included in the multi-channel member. FIGS. 4A to 4C show the glass substrate without a conductive member serving as a conduction path in the wiring substrate.

As shown in FIG. 4A, a glass substrate 9 has a capillary substrate 90. The capillary substrate 90 includes a plurality of multi-channel members 92 having a plurality of through holes 93. The multi-channel members 92 are fused together and integrally formed while being disposed two-dimensionally within a peripheral member 91 formed of a glass material.

For example, such a capillary substrate 90 is integrally formed of a plurality of glass fibers, with the core glass portions being removed to thereby form the plurality of through holes 93.

As shown in FIGS. 4B and 4C, the multi-channel member 92 is configured such that a plurality of hollow glass members 95 that are open at both ends are fused together and integrally formed. The multi-channel member 92 has a square shape (e.g., about 1000 μm×1000 μm) when viewed from a direction perpendicular to the upper and lower surfaces of the capillary substrate 90. The through hole 93 has a circular shape at its opening. For example, the inner diameter of the through hole 93 is about 6 μm.

As described above in relation to the radiation detector, a glass material having a radiation shielding function, e.g., a lead glass material is used as the glass material of the peripheral member 91 and the glass members 95 forming the capillary substrate 90.

As the wiring substrate 20 in the radiation detector shown in FIG. 1, for example, it is possible to use one in which a conductive member serving as a conduction path is formed in the through hole of the glass substrate configured as shown in FIGS. 4A to 4C. That is, in such a glass substrate configured in this manner, the shape of the substrate, the number of the through holes and their location and the like are set according to the configuration of the radiation detector. The conductive member serving as the conduction path is formed in the through hole provided in the glass substrate, and on each of its surfaces, an electrical wiring pattern comprised of respectively required electrodes and wirings is formed. It is thus possible to obtain a wiring substrate which is configured as shown in FIGS. 3A and 3B.

Figure 5A:
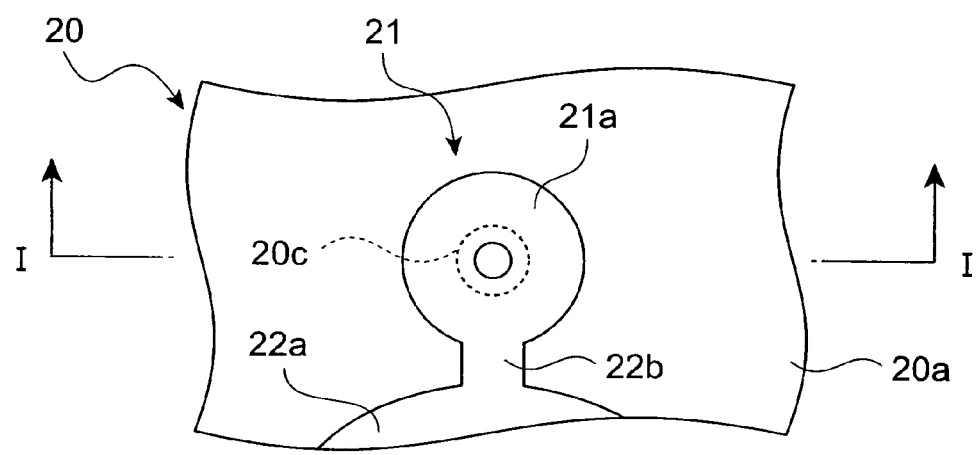
FIGS. 5A and 5B are views illustrating an example of the configuration of a conductive member provided in the through hole of the wiring substrate.
Figure 5B:
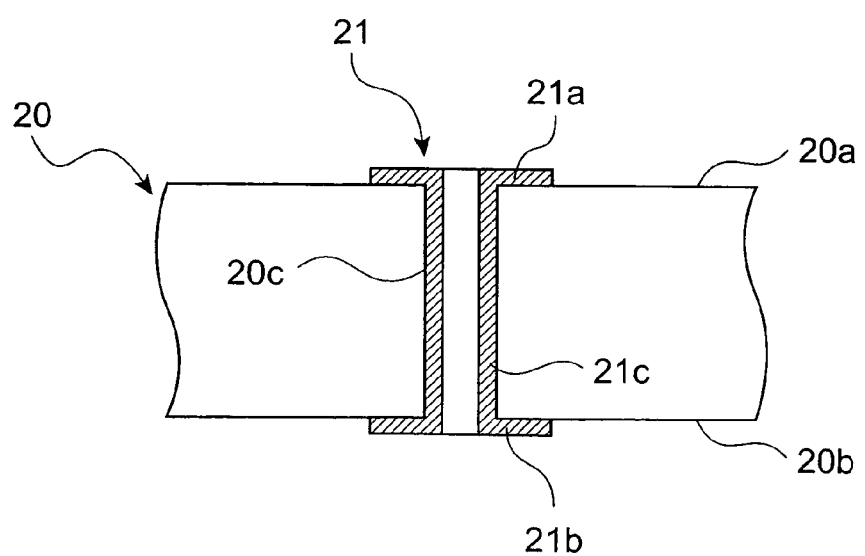

FIGS. 5A and 5B are views illustrating an example of the configuration of the conductive member provided in the through hole of the wiring substrate, FIG. 5A being a top plan view, FIG. 5B being a cross-sectional view taken along arrows I-I. In the wiring substrate 20, a plurality of through holes 20c (e.g., 4×4=16 in number) are formed in a two-dimensional array. As shown in FIG. 5B, each of the through holes 20c is formed to have a circular cross-sectional shape with a center axis of an axis perpendicular to the input surface 20a and the output surface 20b of the wiring substrate 20.

In the exemplary configuration shown in FIGS. 5A and 5B, the conductive member 21 electrically connecting between the input surface 20a and the output surface 20b is provided in the through hole 20c as a member formed on the inner wall of the through hole 20c. That is, the conducting portion 21c is formed in the through hole 20c on the inner wall thereof. Additionally, on the outer peripheral portion of the through hole 20c on the input surface 20a, the input portion 21a is formed in connection with the conducting portion 21c. Furthermore, on the outer peripheral portion of the through hole 20c on the output surface 20b, formed is the output portion 21b in connection with the conducting portion 21c. The conducting portion 21c, the input portion 21a, and the output portion 21b constitute the conductive member 21 serving as the conduction path in the wiring substrate 20.

Figure 6A:
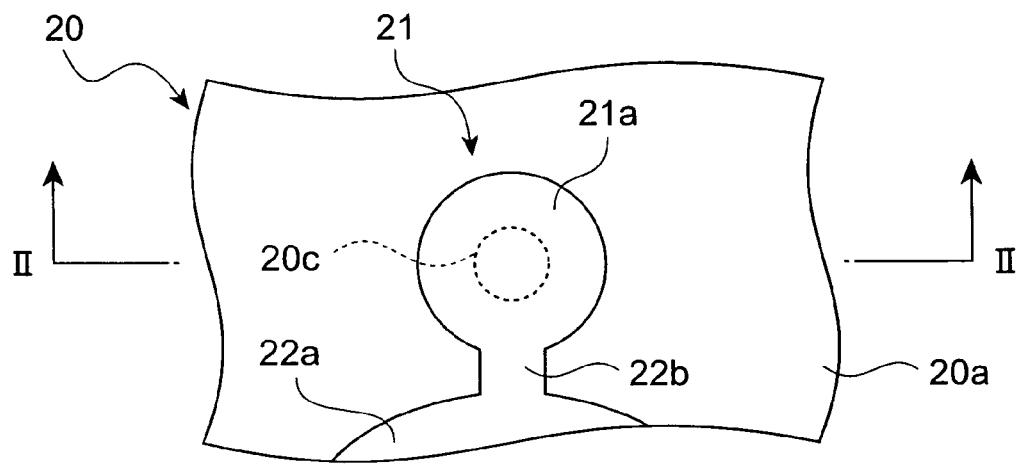
FIGS. 6A and 6B are views illustrating another example of the configuration of a conductive member provided in the through hole of the wiring substrate.
Figure 6B:
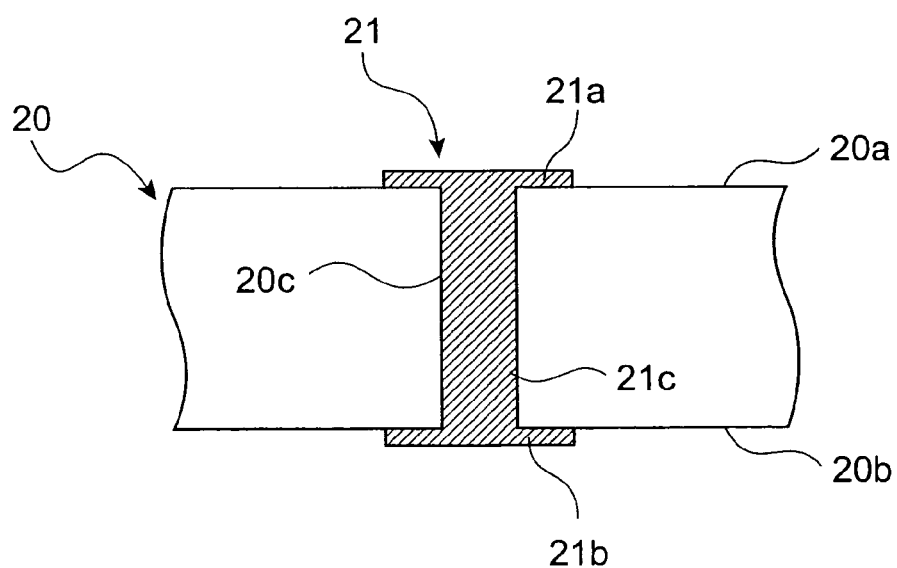

FIGS. 6A and 6B are views illustrating another example of the configuration of the conductive member provided in the through hole of the wiring substrate, FIG. 6A being a top plan view, FIG. 6B being a cross-sectional view taken along arrows II-II. In the wiring substrate 20, a plurality of through holes 20c are formed in a two-dimensional array. As shown in FIG. 6B, each of the through holes 20c is formed to have a circular cross-sectional shape with a center axis of an axis perpendicular to the input surface 20a and the output surface 20b of the wiring substrate 20.

In the exemplary configuration shown in FIGS. 6A and 6B, the conductive member 21 electrically connecting between the input surface 20a and the output surface 20b is provided in the through hole 20c as a member filled in the through hole 20c. That is, the conducting portion 21c is filled in the through hole 20c. Additionally, on the outer peripheral portion of the through hole 20c on the input surface 20a, the input portion 21a is formed in connection with the conducting portion 21c. Furthermore, on the outer peripheral portion of the through hole 20c on the output surface 20b, the output portion 21b is formed in connection with the conducting portion 21c. The conducting portion 21c, the input portion 21a, and the output portion 21b constitute the conductive member 21 serving as the conduction path in the first wiring substrate 20.

For example, the configuration shown in FIGS. 5A and 5B and FIGS. 6A and 6B can be used as the conductive member which is formed as the conduction path in the glass substrate having a plurality of through holes. In addition, the location of the conduction path in the glass substrate serving as the wiring substrate is preferably set according to the configuration of the radiation detector. For example, such an arrangement may be configured such that of a plurality of through holes, a through hole located at a position necessary for a conduction path is selected using a mask or the like to form a conductive member. Alternatively, a through hole may also be selectively provided only at a position requiring a conduction path.

The glass substrate used for the wiring substrate may not be limited to the arrangement shown in FIGS. 4A to 4C but may also employ other arrangements. For example, in FIGS. 4A to 4C, a plurality of glass members each having a through hole are integrated into a multi-channel member, and a plurality of multi-channel members are integrated into a capillary substrate. In contrast to this, a plurality of glass members may also be integrated directly into a capillary substrate. It is preferable to determine how the individual glass members and multi-channel members are shaped and arranged, and whether and how through holes are provided in each member, as appropriate in a preferred manner according to the arrangement of the conduction path. The through hole may also have a polygonal cross-sectional shape other than a circular one, e.g., a rectangular one.

A brief explanation will now be made of a method for manufacturing the radiation detector shown in FIG. 1 in accordance with its specific exemplary configuration.

First, prepared is a glass substrate which is formed of a glass material such as lead glass having a radiation shielding function and with through holes at predetermined positions. Then, the conductive members serving as the conduction paths are formed in the through holes, and additionally, an electrical wiring pattern having respectively required electrodes and wirings is formed on both the input and output surfaces to fabricate the wiring substrate 20 used in the wiring substrate section 2.

More specifically, for the wiring substrate of the wiring substrate section 2, the conductive member 21 made up of the conducting portion 21c, the input portion 21a, and the output portion 21b is formed in the through hole 20c provided in the glass substrate. Additionally, formed are the electrode pad 22a and the wiring 22b on the input surface 20a as well as the electrode pads 23a, 23c, and 24, and the wirings 23b and 23d on the output surface 20b, thereby providing the wiring substrate 20.

For example, the above-described conductive member and the electrical wiring pattern provided on the glass substrate can be formed of an electrically conductive metal layer of titanium nitride (TiN), nickel (Ni), aluminum (Al), chromium (Cr), copper (Cu), silver (Ag), gold (Au), or an alloy thereof. Such a metal layer may be a single metal layer, a composite film, or a layered film. Specifically, the layer may be formed by providing a mask of a desired pattern on the glass substrate to form a metal film by vapor deposition, CVD, plating, or sputtering, and then by removing the mask. Alternatively, it is also possible to pattern and etch a photo-resist after deposition of a metal film, or to employ lift-off or the like for patterning. If required, bump electrodes may be further formed on the wiring substrate 20.

The wiring substrate section 2 of the wiring substrate 20 is fabricated as described above, then, the IC chips of the signal processing elements 30 and 32 with the bump electrodes 31 and 33 formed thereon are aligned with the electrode pads 23a and 23c provided on the output surface 20b of the wiring substrate 20, respectively, for physical and electrical connection therebetween. Furthermore, the PD array 15 with the bump electrodes 17 formed thereon is also aligned with the electrode pads 22a provided on the input surface 20a of the wiring substrate 20 for physical and electrical connection therebetween.

For example, as a bump material to form the bump electrodes 31, 33, and 17, it is possible to use nickel (Ni), copper (Cu), silver (Ag), gold (Au), solder, resin containing an electrically conductive filler, or a composite material thereof. It is also acceptable to interpose an under-bump metal (UBM) between the bump electrode and the underlying electrode pad in order to prevent the metals from diffusing into each other or enhance their mutual contact.

Subsequently, the housing 40 having the bump electrodes 44 formed thereon is aligned with the electrode pads 24 provided on the output surface 20b of the wiring substrate 20 for physical and electrical connection therebetween. This allows for performing an input and output operation of a signal between an external circuit via the leads 43 provided on the housing 40. Furthermore, the scintillator 10 is implemented using the optical adhesive 11 on the light-incident surface 15a of the PD array 15, thereby providing the radiation detector shown in FIG. 1.

FIG. 7 is a sectional side view illustrating the sectional structure of a radiation detector according to a second embodiment. FIG. 8 is an exploded perspective view illustrating components in the configuration of the radiation detector shown in FIG. 7.

The radiation detector shown in FIG. 7 includes the radiation detecting section 1, the wiring substrate section 2, the signal processing section 3, and the housing 40. Of these components, the configurations of the radiation detecting section 1 and the housing 40 are the same as those of the embodiment shown in FIG. 1.

The wiring substrate section 2 is located downstream of the radiation detecting section 1. In this embodiment, the wiring substrate section 2 has a wiring substrate 25 in which provided is a conduction path for guiding an electric signal between the signal input surface and the signal output surface. The wiring substrate 25 employs, as its substrate, a glass substrate formed of a predetermined glass material having a radiation shielding function. For example, as such a glass material, it is preferable to use a lead glass which contains lead in it.

Figure 9A:
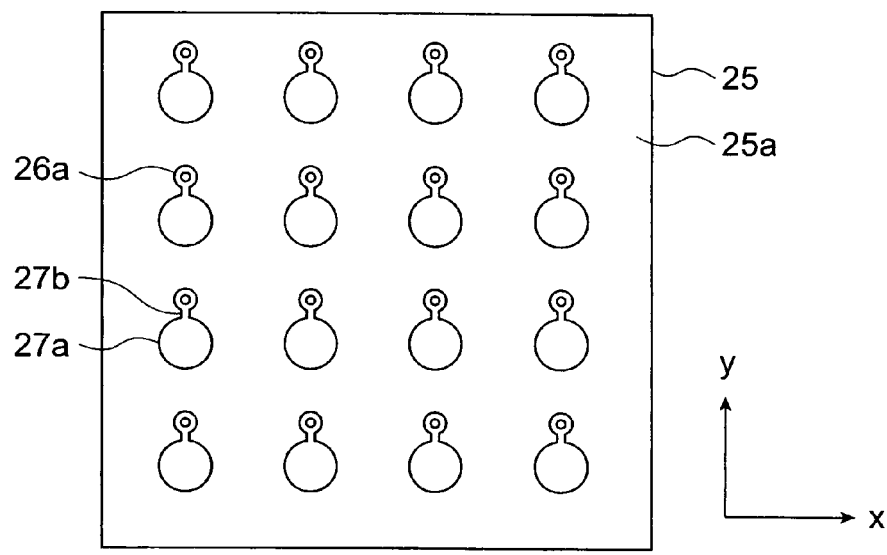
FIGS. 9A and 9B are plan views illustrating (A) the configuration of a signal input surface of a wiring substrate, and (B) the configuration of a signal output surface thereof.
Figure 9B:
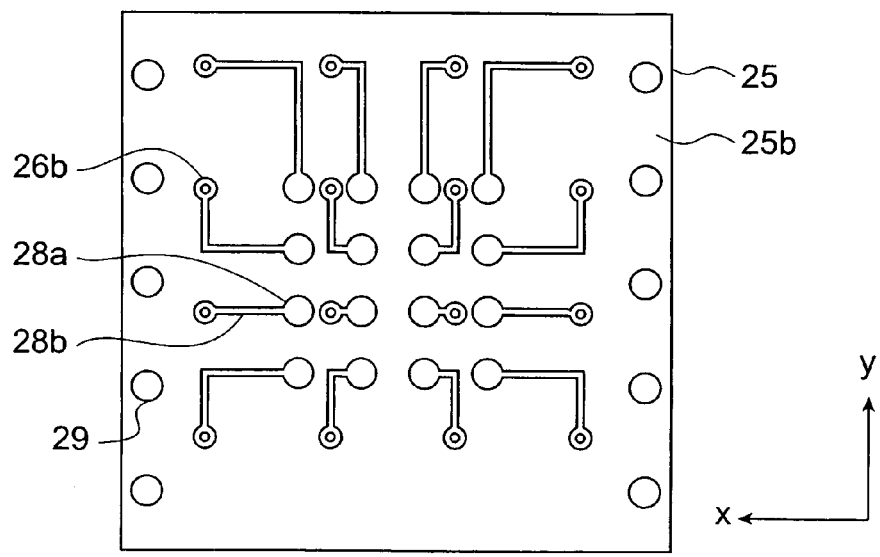

FIGS. 9A and 9B are plan views each illustrating the configuration of the wiring substrate 25, FIG. 9A illustrating its upper surface as a signal input surface 25a, FIG. 9B illustrating its lower surface as a signal output surface 25b.

The glass substrate constituting the wiring substrate 25 has a plurality of through holes 25c between the input surface 25a and the output surface 25b. Each of the through holes 25c is provided with a conductive member 26, which serves as a conduction path for electrically connecting between the input surface 25a and the output surface 25b. This embodiment employs the configuration in which provided are the through holes 25c and the conductive members 26 equal in number to 4×4=16, corresponding to the configuration of the PD array 15. These through holes 25c and conductive members 26 are formed with the same pitch as those of the bump electrodes 17 in the PD array 15. The through holes and the conductive members for the substrate electrodes of the photodiodes are not illustrated.

More specifically, the conductive member 26 includes a conducting portion 26c formed inside the through hole 25c, an input portion 26a formed on the outer peripheral portion of the through hole 25c on the input surface 25a in connection with the conducting portion 26c, and an output portion 26b formed on the outer peripheral portion of the through hole 25c on the output surface 25b in connection with the conducting portion 26c.

As shown in FIG. 9A, there is provided an electrode pad 27a on the input surface 25a of the wiring substrate 25 in addition to the input portion 26a of the conductive member 26. The electrode pad 27a is positioned corresponding to the bump electrode 17 on the output surface 15b of the PD array 15. The electrode pad 27a is also electrically connected to the corresponding input portion 26a of the conductive member 26 via a wiring 27b. This configuration allows the photodiode 16 for outputting a detected signal of the PD array 15 to be electrically connected via the bump electrode 17, the electrode pad 27a, and the wiring 27b to the conductive member 26 of the conduction path that transfers the detected signal in the wiring substrate 25.

As shown in FIG. 9B, an electrode pad 28a is formed on the output surface 25b of the wiring substrate 25 in addition to the output portion 26b of the conductive member 26. The electrode pad 28a is electrically connected to the output portion 26b of the corresponding conductive member 26 via a wiring 28b. There is also provided an electrode pad 29 on the output surface 25b. The electrode pad 29 is used for connection to the housing 40. Although not illustrated, part or all of the electrode pads 29 are electrically connected to a predetermined portion of the signal processing element.

In this embodiment, the portion excluding the conducting portion 26c inside the through hole 25c is filled with a shield member 18 of a predetermined shield material having a radiation shielding function. This configuration allows the opening of the through hole 25c leading from the signal input surface 25a of the wiring substrate 25 to the signal output surface 25b to be blocked with the shield member 18.

The signal processing section 3 and the housing 40 are placed downstream of the wiring substrate section 2. In this embodiment, the signal processing section 3 includes a signal processing element 34 which is provided with a signal processing circuit for processing the detected signal from the PD array 15 of the radiation detecting section 1.

On the upper surface of the signal processing element 34, there is provided a bump electrode 35. The bump electrode 35 is positioned corresponding to the electrode pad 28a on the output surface 25b of the wiring substrate 25. This configuration allows the conductive member 26 in the wiring substrate 25 to be electrically connected via the output portion 26b, the wiring 28b, the electrode pad 28a, and the bump electrode 35 to the signal processing circuit provided in the signal processing element 34.

In the above-mentioned arrangement, radiation such as an X-ray made incident upon the scintillator 10 of the radiation detecting section 1 will generate scintillation light in the scintillator 10, allowing the scintillation light to be made incident upon the photodiodes 16 of the PD array 15 via the optical adhesive 11. The photodiodes 16 detect this scintillation light to output electric signals as detected signals corresponding to the detection of the radiation.

The detected signal outputted from each of the photodiodes 16 of the PD array 15 is sent to the signal processing element 34 via the corresponding bump electrode 17, conductive member 26 of the wiring substrate 25, and bump electrode 35 sequentially. Then, the signal processing circuit of the signal processing element 34 performs the required signal processing on the detected signal.

An explanation will now be made to the effects of the radiation detector according to this embodiment.

In the radiation detector shown in FIG. 7 to FIGS. 9A and 9B, the wiring substrate 25 used for electrically connecting between the radiation detecting section 1 and the signal processing section 3 is formed of a glass substrate of a predetermined glass material. Additionally, the shield member 18 for blocking the opening of the through hole 25c in the wiring substrate 25 is provided in the through hole 25c of the conduction path provided in the glass substrate, thereby allowing the signal processing element 34 not to be seen through the through hole 25c.

According to such an arrangement, a portion with no through hole 25c in the wiring substrate 25 allows the glass material thereof to suppress radiation transmitting from the signal input surface 25a to the signal output surface 25b. Even another portion with the through hole 25c in the wiring substrate 25 will also allow the shield member 18 to block the radiation passing through the through hole 25c. This allows for suppressing the radiation made incident upon the signal processing section 3 irrespective of the presence of the through hole 25c in the wiring substrate 25, thereby realizing a radiation detector which can ensure that degradation resulting from damage due to radiation in characteristics such as sensitivity, reliability, and life is suppressed.

Like the wiring substrate 20 shown in FIG. 1, for example, a wiring substrate in which the conductive member serving as the conduction path is formed in the through hole of the glass substrate configured as shown in FIGS. 4A to 4C can be used as the wiring substrate 25 in the radiation detector shown in FIG. 7.

Figure 10:
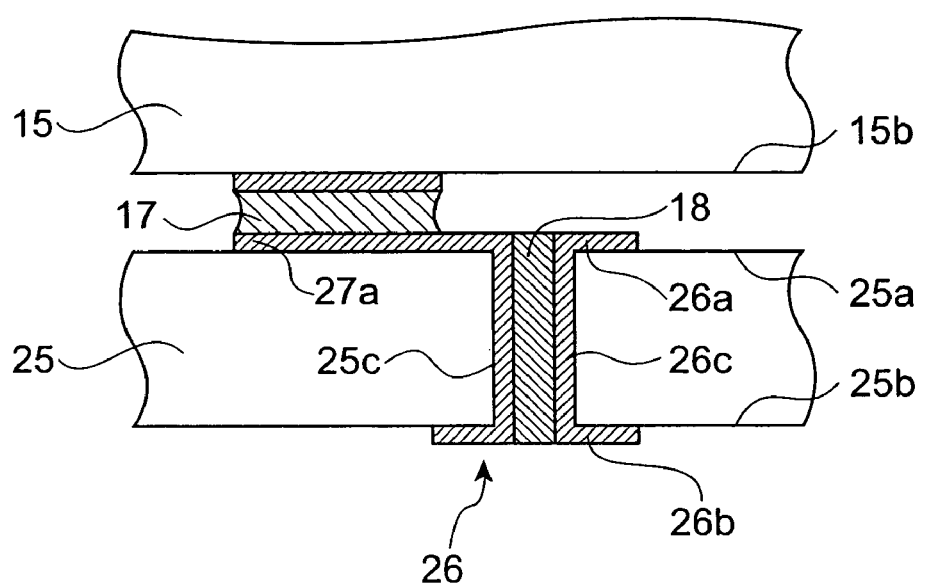
FIG. 10 is a view illustrating an example of the configuration of a through hole and a shield member in the wiring substrate.

FIG. 10 is a cross-sectional view illustrating an example of the configuration of the through hole in the wiring substrate and the shield member for blocking the through hole. In the wiring substrate 25, a plurality of through holes 25c (e.g., 4×4=16 in number) are formed in a two-dimensional array. Each of the through holes 25c is formed to have a circular cross-sectional shape with a center axis of an axis perpendicular to the input surface 25a and the output surface 25b of the wiring substrate 25. The electrode pad 27a electrically connected to the conductive member 26 is connected with the bump electrode 17 provided on the output surface 15b of the PD array 15.

In the exemplary configuration shown in FIG. 10, the conductive member 26 is provided in the through hole 25c as a member formed on the inner wall in the through hole 25c. That is, the conducting portion 26c is formed on the inner wall of the through hole 25c. Additionally, the input portion 26a and the output portion 26b are formed on the input surface 25a and the output surface 25b, respectively.

Furthermore, filled inside the conducting portion 26c of the through hole 25c is the shield member 18 which is formed of an electrically conductive shield material such as lead and which serves as a conducting portion together with the conducting portion 26c. The conductive member 26 and the shield member 18 constitute a conductive member serving as a conduction path in the wiring substrate 25. The opening of the through hole 25c is blocked with the shield member 18 having a radiation shielding function, thereby suppressing radiation passing through the through hole 25c.

Figure 11:
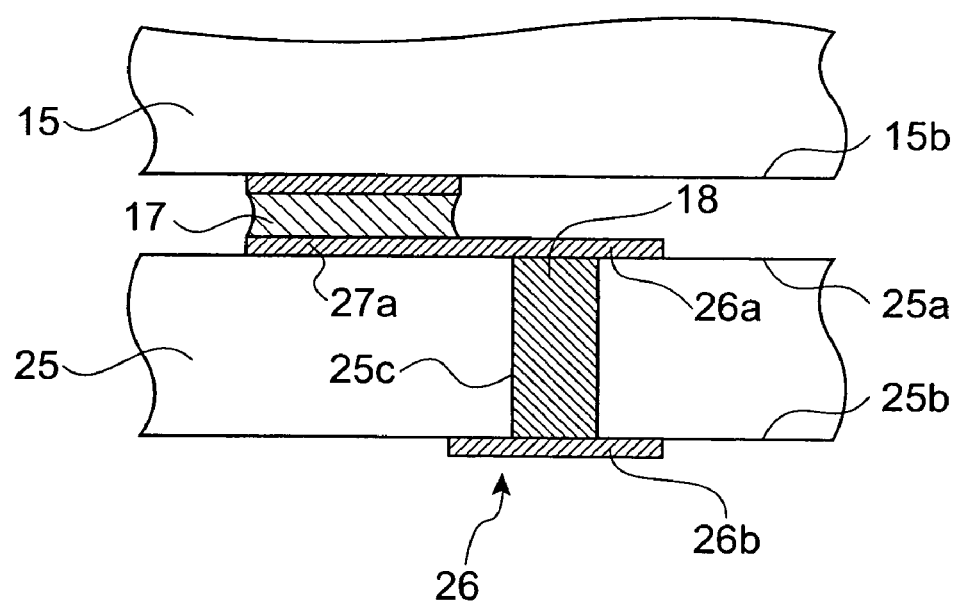
FIG. 11 is a view illustrating another example of the configuration of a through hole and a shield member in the wiring substrate.

FIG. 11 is a cross-sectional view illustrating another example of the configuration of the through hole in the wiring substrate and the shield member blocking the through hole. The configuration of the through hole 25c, the electrode pad 27a and the like according to this example is the same as that shown in FIG. 10.

In the exemplary configuration shown in FIG. 11, the conductive member 26 of the through hole 25c is shown only with the input portion 26a on the input surface 25a and the output portion 26b on the output surface 25b. Filled entirely inside the through hole 25c is the shield member 18 which is formed of an electrically conductive shield material such as lead and which serves as a conducting portion. The conductive member 26 and the shield member 18 constitute a conductive member serving as a conduction path in the wiring substrate 25. The opening of the through hole 25c is blocked with the shield member 18 having a radiation shielding function, thereby suppressing the radiation passing through the through hole 25c.

The shield member 18 filled in the through hole 25c is preferably formed of an electrically conductive material as described above so that the shield member 18 functions as part of the conduction path between the input surface 25a and the output surface 25b. However, as shown in FIG. 10, the arrangement with the conducting portion 26c provided inside the through hole 25c may also employ a material of low electrical conductivity so long as the material has a radiation shielding function. As the arrangement with the shield member blocking the through hole, it may be possible to use other various arrangements than those shown in FIG. 10 and FIG. 11.

Figure 12:
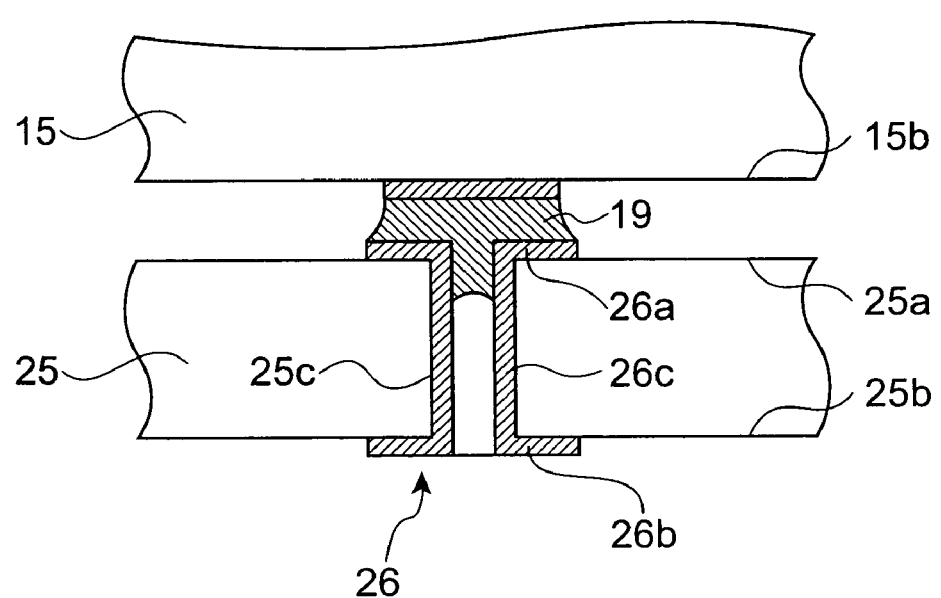
FIG. 12 is a view illustrating still another example of the configuration of a through hole and a shield member in the wiring substrate.

FIG. 12 is a cross-sectional view illustrating another example of the configuration of the through hole in the wiring substrate and the shield member for blocking the through hole. In the wiring substrate 25, a plurality of through holes 25c (e.g., 4×4=16 in number) are formed in a two-dimensional array. Each of the through holes 25c is formed to have a circular cross-sectional shape with a center axis of an axis perpendicular to the input surface 25a and the output surface 25b of the wiring substrate 25.

In the exemplary configuration shown in FIG. 12, the conductive member 26 is provided in the through hole 25c as a member formed on the inner wall of the through hole 25c. That is, the conducting portion 26c is formed on the inner wall of the through hole 25c. Additionally, the input portion 26a and the output portion 26b are formed on the input surface 25a and the output surface 25b, respectively.

Furthermore, in this exemplary configuration, the input portion 26a itself of the conductive member 26 is employed as an electrode pad without the electrode pad 27a provided on the input surface 25a of the wiring substrate 25. On the output surface 15b of the PD array 15, instead of the bump electrode 17, there is provided a shield bump electrode 19 of a predetermined shield material, such as a solder containing lead, having a radiation shielding function. The shield bump electrode 19 is electrically connected to the conductive member 26 provided in the through hole 25c. As such, the opening of the through hole 25c is blocked with the shield bump electrode 19 of a shield member having a radiation shielding function, thereby suppressing the radiation passing through the through hole 25c.

The radiation detector according to the present invention is not limited to the above-mentioned embodiments but may be modified in a variety of ways. For example, the PD array 15 provided as a semiconductor photodetecting element array in the radiation detecting section 1 may be of a front incident type which has photodiodes formed on the light-incident surface (front surface) 15a, or alternatively of a rear incident type which has photodiodes formed on the signal output surface (rear surface) 15b. The number and arrangement of the photodiodes serving as photodetecting elements may be set as appropriate.

Detected signals from the photodiodes can be outputted through the output surface 15b according to a specific arrangement of the PD array. For example, it is possible to use a wiring pattern formed on the output surface 15b or a penetrating electrode formed in the PD array 15 for that purpose.

The radiation detector shown in FIG. 1 and FIG. 7 employs the radiation detecting section 1 that is adapted to have the scintillator 10 for generating scintillation light resulting from radiation being made incident thereon, and the PD array 15 with the photodiodes 16 serving as semiconductor photodetecting elements for detecting the scintillation light from the scintillator 10. Such an arrangement is of an indirect detection type in which the incident radiation such as an X-ray is converted into light of a predetermined wavelength (e.g., visible light) in the scintillator 10, which is in turn detected by a semiconductor photodetecting element such as a Si-PD array.

Alternatively, as the radiation detecting section, it is also possible to use an arrangement without a scintillator in which a semiconductor detecting element detects incident radiation. Such an arrangement is of a direct detection type in which incident radiation such as an X ray is detected by a semiconductor detecting element that is formed of CdTe, CdZnTe, or silicon adapted to have a thickness sufficient to absorb X-rays or the like. For example, this arrangement corresponds to those of FIG. 1 and FIG. 7, in which the scintillator 10 is excluded and the PD array 15 is replaced by a semiconductor detecting element array. Here, the detector may be of a photovoltaic type (photodiode) or photoconductive type.

As in the above-mentioned embodiments, it is preferable to use a direct bonding method for electrical connection via the bump electrode to connect between the wiring substrate section 2 and the radiation detecting section 1, and between the wiring substrate section 2 and the signal processing section 3. Such metal bump electrodes can be used as electrical connection means, thereby electrically connecting between each portion in a preferred manner.

Alternatively, other than the above-mentioned arrangement using bump electrodes, it may also be possible to employ those methods using, e.g., an under-fill resin after the bump electrodes are connected, an anisotropic conductive film (ACF) method, an anisotropic conductive paste (ACP) method, or a non-conductive paste (NCP) method. Furthermore, a passivation film of an insulating substance may be deposited on each substrate, as required, with an opening for the electrode pad.

It is also possible to use various arrangements other than that shown in FIG. 1 for the radiation detector in which the signal processing element of the signal processing section is disposed relative to the through hole of the conduction path provided in the wiring substrate so as to be dislocated from an area where the through hole is provided.

Figure 13:
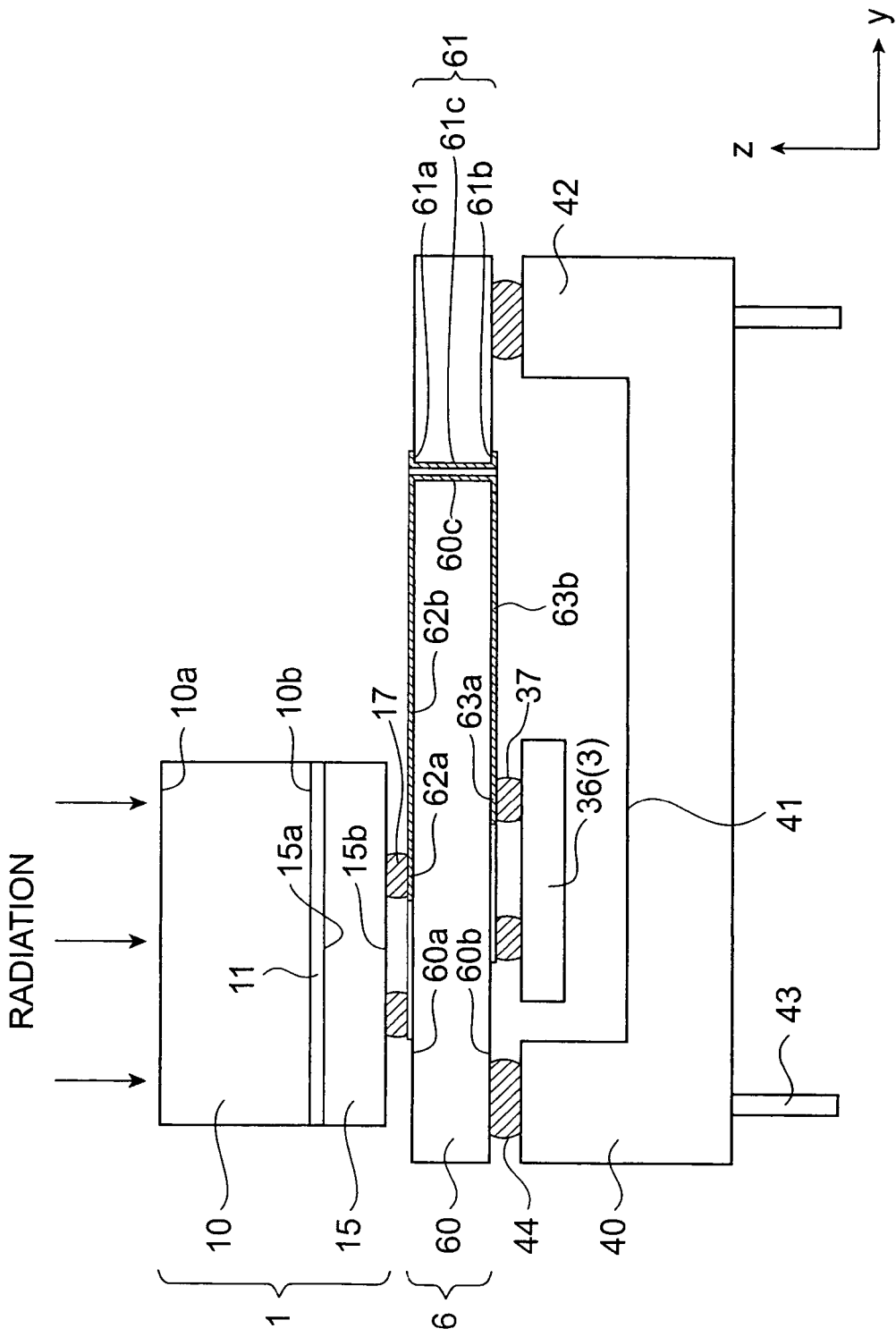
FIG. 13 is a sectional side view illustrating the sectional structure of a radiation detector according to a third embodiment.
Figure 14:
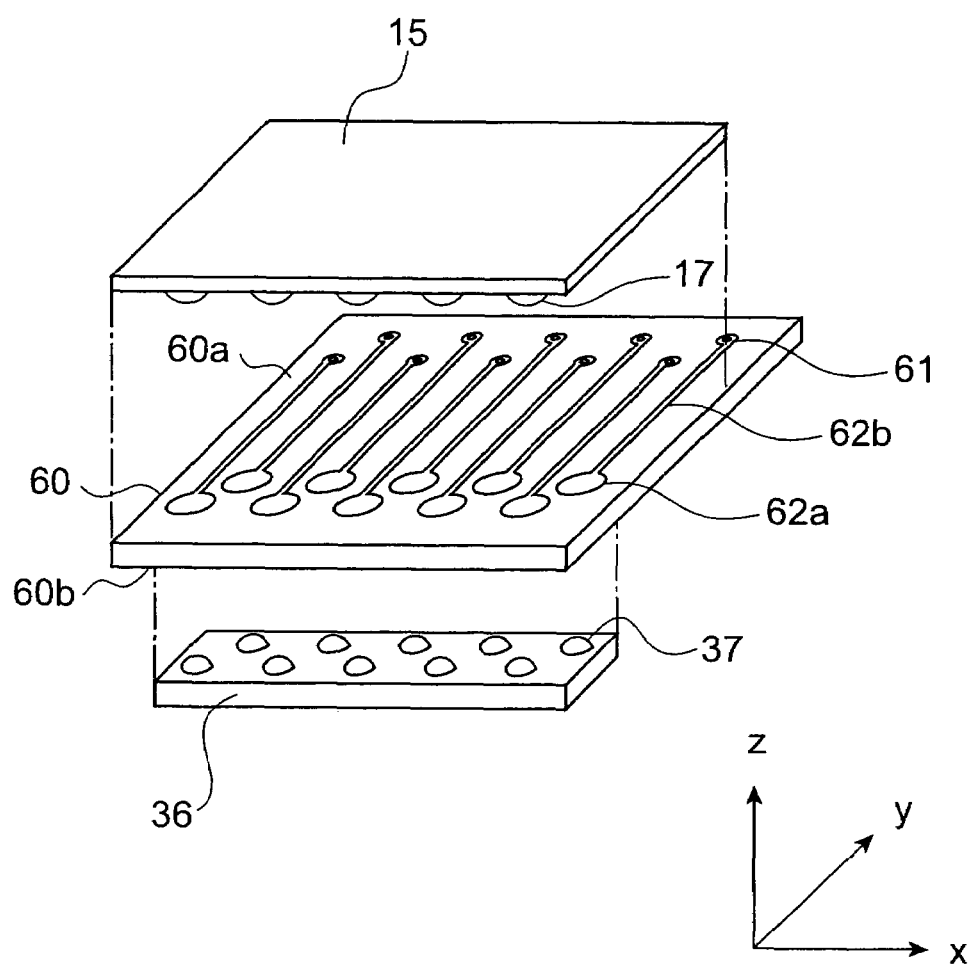
FIG. 14 is an exploded perspective view illustrating the configuration of the radiation detector shown in FIG. 13.

FIG. 13 is a sectional side view illustrating the sectional structure of a radiation detector according to a third embodiment. FIG. 14 is an exploded perspective view illustrating components in the configuration of the radiation detector shown in FIG. 13. In FIG. 14, the scintillator 10 and the housing 40 are not illustrated.

The radiation detector shown in FIG. 13 includes the radiation detecting section 1, a wiring substrate section 6, the signal processing section 3, and the housing 40. Of these components, the configurations of the radiation detecting section 1 and the housing 40 are the same as those of the embodiment shown in FIG. 1.

The wiring substrate section 6 is located downstream of the radiation detecting section 1. In this embodiment, the wiring substrate section 6 has a wiring substrate 60 in which provided is a conduction path for guiding an electric signal between the signal input surface and the signal output surface. The wiring substrate 60 employs, as its substrate, a glass substrate formed of a predetermined glass material having a radiation shielding function.

Furthermore, the wiring substrate section 6 has an area in a predetermined range on the negative side of the y-axis (first area) where implemented are the radiation detecting section 1 and the signal processing section 3, and an area in a predetermined range on the positive side (second area) where implemented are through holes 60c. In relation to the through hole 60c provided in the second area, there is formed a conductive member 61 which includes a conducting portion 61c formed inside the through hole 60c, an input portion 61a on an input surface 60a, and an output portion 61b on an output surface 60b.

There is provided an electrode pad 62a in the first area on the input surface 60a of the wiring substrate 60 in addition to the input portion 61a of the conductive member 61 provided in the second area. The electrode pad 62a is positioned corresponding to the bump electrode 17 on the output surface 15b of the PD array 15. The electrode pad 62a is electrically connected to the corresponding input portion 61a of the conductive member 61 via a wiring 62b.

Likewise, there is provided an electrode pad 63a in the first area on the output surface 60b of the wiring substrate 60 in addition to the output portion 61b of the conductive member 61 provided in the second area. The electrode pad 63a is positioned corresponding to a bump electrode 37 on the upper surface of a signal processing element 36 in the signal processing section 3. The electrode pad 63a is electrically connected to the, corresponding output portion 61b of the conductive member 61 via a wiring 63b.

In such an arrangement, the signal processing element 36 of the signal processing section 3 is implemented in the first area which is dislocated from the second area where the through hole 60c is provided, thereby allowing the signal processing element 36 not to be seen through the through hole 60c. Like the arrangement shown in FIG. 1, this arrangement also allows for suppressing the radiation made incident upon the signal processing section 3 irrespective of the presence of the through hole 60c in the wiring substrate 60. This allows for realizing a radiation detector which can ensure that degradation resulting from damage due to radiation in reliability, and life is suppressed.

INDUSTRIAL APPLICABILITY

As described in detail above, the radiation detector according to the present invention is available as a radiation detector which suppresses radiation made incident upon the signal processing means located downstream of the wiring substrate.

That is, the wiring substrate used to electrically connect between the radiation detecting means and the signal processing means is formed of a glass substrate of a predetermined glass material. Additionally, the signal processing means is disposed relative to the through hole of the conduction path provided in the glass substrate so as to be dislocated from an area where the through hole is provided, thereby allowing the signal processing means not to be seen through the through hole. In this arrangement, a portion with no through hole in the wiring substrate allows the glass material thereof to suppress radiation transmitting from the signal input surface to the signal output surface. Even another portion with a through hole in the wiring substrate will also allow radiation having passed through the through hole not to be made incident on the signal processing means. This allows for realizing a radiation detector which suppresses radiation made incident on the signal processing means irrespective of the presence of the through hole in the wiring substrate.

Likewise, the wiring substrate used to electrically connect between the radiation detecting means and the signal processing means is formed of a glass substrate of a predetermined glass material. Additionally, the shield member for blocking the opening of the through hole in the wiring substrate is disposed in the through hole of the conduction path provided in the glass substrate, thereby allowing the signal processing means not to be seen through the through hole. In this arrangement, a portion with no through hole in the wiring substrate allows the glass material thereof to suppress radiation transmitting from the signal input surface to the signal output surface. Even another portion with a through hole in the wiring substrate will also allow the shield member to suppress radiation passing through the through hole. This allows for realizing a radiation detector which suppresses radiation made incident on the signal processing means irrespective of the presence of the through hole in the wiring substrate.

The invention claimed is:

1. A radiation detector comprising:
radiation detecting means for detecting incident radiation to output a detected signal,
signal processing means for processing the detected signal from the radiation detecting means, and
a wiring substrate section having a wiring substrate with a conduction path provided for guiding the detected signal between a signal input surface and a signal output surface, the radiation detecting means and the signal processing means being connected to the signal input surface and the signal output surface, respectively, wherein
the wiring substrate includes a glass substrate formed of a predetermined glass material having a radiation shielding function and provided with a through hole, and a conductive member provided in the through hole to serve as the conduction path for establishing electrical continuity between the signal input surface and the signal output surface, and
the radiation detecting means, the wiring substrate section, and the signal processing means are located in that order along a predetermined alignment direction, while an opening of the through hole provided in the wiring substrate from the signal input surface to the signal output surface is blocked with a shield member having a radiation shielding function.

2. The radiation detector according to claim 1, wherein the shield member is configured such that a predetermined shield material having a radiation shielding function is filled in the through hole.

3. The radiation detector according to claim 1, wherein the shield member is a bump electrode which is formed of a predetermined shield material having a radiation shielding function and which is electrically connected to the conductive member provided in the through hole.

4. The radiation detector according to claim 1, wherein the glass substrate is formed of the glass material that contains lead.

5. The radiation detector according to claim 1, wherein the conductive member is formed on an inner wall of the through hole provided in the glass substrate.

6. The radiation detector according to claim 1, wherein the conductive member is filled in the through hole provided in the glass substrate.

7. The radiation detector according to claim 1, wherein the glass substrate is provided with the plurality of through holes while a plurality of hollow glass members that are open at both ends are fused together and integrally formed.

8. The radiation detector according to claim 1, wherein the radiation detecting means includes a scintillator for generating scintillation light by radiation made incident, and a semiconductor photodetecting element for detecting the scintillation light from the scintillator.

9. The radiation detector according to claim 1, wherein the radiation detecting means includes a semiconductor detecting element for detecting radiation made incident thereon.

10. The radiation detector according to claim 1, wherein at least either the wiring substrate section and the radiation detecting means or the wiring substrate section and the signal processing means are electrically connected to each other via a bump electrode.

* * * * *